(12) United States Patent
Hiramatsu (10) Patent No.: US 8,471,458 B2
(45) Date of Patent: Jun. 25, 2013

(54) LIGHT EMITTING DEVICE

(75) Inventor: Ryosuke Hiramatsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 13/033,086

(22) Filed: Feb. 23, 2011

(65) Prior Publication Data

US 2012/0043559 A1    Feb. 23, 2012

(30) Foreign Application Priority Data

Aug. 20, 2010    (JP) ................ 2010-185242

(51) Int. Cl.
*H01L 33/08*    (2010.01)
(52) U.S. Cl.
USPC ....... 313/503; 252/301.4 F; 257/88; 257/100; 257/E33.061; 313/501; 313/502
(58) Field of Classification Search
USPC   257/88, 98, 100, 103, E33.061; 252/301.4 F, 252/301.4 H; 313/501–503
See application file for complete search history.

(56) References Cited

U.S. PATENT DOCUMENTS

2010/0051974 A1*    3/2010    Krames ..................... 257/89

FOREIGN PATENT DOCUMENTS

| JP | 10-190053 | 7/1998 |
|---|---|---|
| JP | 2003-101081 | 4/2003 |
| JP | 2008-28042 | 2/2008 |
| JP | 2008-202044 | 9/2008 |
| JP | 2009-260319 | 11/2009 |

OTHER PUBLICATIONS

Notification of Reason for Rejection issued Sep. 21, 2012 in Japanese Patent Application No. 2010-185242 (with English translation).
U.S. Appl. No. 12/883,676, filed Sep. 16, 2010, Ryosuke Hiramatsu.
Office Action issued Jul. 13, 2012 in Japanese Patent Application No. 2010-185242 (with English-language translation).

* cited by examiner

*Primary Examiner* — Lynne Gurley
*Assistant Examiner* — Vernon P Webb
(74) *Attorney, Agent, or Firm* — Oblon, Spivak, McClelland, Maier & Neustadt, L.L.P.

(57) ABSTRACT

There is provided a light emitting device which includes a light emitting element having a main emission peak in the wavelength region of greater than 420 nm and equal to or less than 500 nm, and a phosphor layer formed on the light emitting element. The light emitting element of this light emitting device has a junction temperature of from 100° C. to 200° C. at the time of continuous driving. Furthermore, the phosphor layer contains a phosphor represented by the following general formula (A), which absorbs the light emitted from the light emitting element and thereby emits light having a main emission peak in the wavelength region of equal to or greater than 650 nm and equal to or less than 665 nm:

$$(Mg_{1-x}AE_x)_a(Ge_{1-y}Sn_y)_bO_cHA_d{:}zMn \qquad (A)$$

wherein AE represents at least one or more elements selected from the group consisting of Ca or Sr;
HA represents at least one or more elements selected from the group consisting of F or Cl;
$2.54 \leq a \leq 4.40$,
$0.80 \leq b \leq 1.10$,
$3.85 \leq c \leq 7.00$,
$0 \leq d \leq 2.00$,
$0 \leq x \leq 0.05$,
$0 \leq y \leq 0.10$, and
$0 < z \leq 0.03$.

16 Claims, 5 Drawing Sheets

F I G. 1

F I G. 2

F I G. 3

F I G. 4

F I G. 5

F I G. 6

F I G. 7

F I G. 8

F I G. 9

F I G. 10

LIGHT EMITTING DEVICE

CROSS REFERENCE TO RELATED APPLICATIONS

This application is based upon and claims the benefit of priority from the prior Japanese Patent Application No. 2010-185242, filed on Aug. 20, 2010, the entire contents of which are incorporated herein by reference.

FIELD

The present invention relates to a light emitting device.

BACKGROUND

A light emitting diode (LED) light emitting device is mainly constructed from a combination of an LED chip as an excitation light source and phosphors, and is capable of realizing a variety of luminescent colors by means of the combination.

It is general, in white LED light emitting devices that emit white light, to use a combination of an LED chip that emits light having a wavelength in the region from ultraviolet to blue, and a phosphor. An example of such a combination may be a combination of an LED chip that emits blue light, and a phosphor mixture that emits light by absorbing the light emitted from the LED. In this case, a phosphor that emits yellow light, which is a complementary color of blue, is mainly used as the phosphor, and the combination is used as a light emitting device which emits quasi-white light on the whole. In addition to that, there has also been developed a three-wavelength type white LED light emitting device which uses a combination of an LED chip that emits blue light, a green or yellow phosphor and a red phosphor.

As one of red phosphors, $3.5MgO.0.5MgF_2.GeO_2:Mn$ is known. Furthermore, there has also been suggested a white LED light emitting device which combines the red phosphor mentioned above, an yttrium-aluminum-garnet (YAG)-based yellow phosphor, and a blue semiconductor light emitting element. Phosphors used in white LED light emitting devices are required to exhibit large absorption of the light emitted from an LED chip, which serves as an excitation light source, and efficient emission of visible light. When it is intended to use an LED light emitting device for the purpose of illumination applications or display backlight applications, a light emitting device having two or more kinds of phosphors is preferred, from the viewpoints of characteristics such as color rending properties, which represent the visuality of an object, and the color gamut which expresses rich colors.

In addition, there has been a demand in recent years for further enhancement of the luminance of LED light emitting devices, and attention has been paid to high power type LED light emitting devices. High power type LED light emitting devices generally require larger input electric power as compared with conventional LED light emitting devices. As a result, high power type LED light emitting devices have a strong tendency that the temperature in the vicinity of the LED chip increases even during a short time driving. When such a temperature increase occurs, the phosphor in the phosphor layer generally experiences a change in the luminescence properties. Particularly, in the case of a white LED light emitting device, as a result of a decrease in the luminescence intensity of the phosphor, there occur problems such as a decrease in the luminance of the light emitted from the light emitting device, and a color shift in the light emitted from the light emitting device, which is caused by a disruption in the balance between the LED chip and the luminescence intensity of the phosphor.

DETAILED DESCRIPTION

Embodiments will now be explained with reference to the accompanying drawings.

The light emitting device according to embodiments of the invention is a device which includes a light emitting element having a main emission peak in the wavelength region of greater than 420 nm and equal to or less than 500 nm, and a phosphor layer formed on the light emitting element. The junction temperature of the light emitting element at the time of continuous driving of the light emitting device is from 100° C. to 200° C. In addition, the phosphor layer contains a phosphor represented by the following general formula (A), which absorbs the light emitted from the light emitting element and thereby emits light having a main emission peak in the wavelength region of equal to or greater than 650 nm and equal to or less than 665 nm:

$$(Mg_{1-x},AE_x)_a(Ge_{1-y},Sn_y)_bO_cHA_d:zMn \qquad (A)$$

wherein AE represents at least one or more elements selected from the group consisting of calcium (Ca) and strontium (Sr);

HA represents at least one or more elements selected from the group consisting of fluorine (F) or chlorine (Cl);

2.54≦a≦4.40,
0.80≦b≦1.10,
3.85≦c≦7.00,
0≦d≦2.00,
0≦x≦0.05,
0≦y≦0.10, and
0<z≦0.03.

Hereinafter, embodiments of the invention will be described in detail. The embodiments described below illustrate examples of the phosphor and the light emitting device for embodying the technical idea of the invention, and are not intended to be limited to the following examples.

Furthermore, members disclosed in the claims are not intended to be specific to the embodiments described herein.

Particularly, the size, material, shape, arrangement and the like of the constituent components described in the embodiments are not intended to limit the scope of the invention, and are for illustrative purposes only. With regard to the respective elements constituting the invention, plural elements may be constructed from a same member, so that a same member may be used as plural elements. On the contrary, the function of a same member can be assigned to and realized by plural members.

The inventors of the present invention found that a particular phosphor has a unique property of the light emission spectrum that changes with an increase in temperature. This particular phosphor is represented by the following general formula (A):

$$(Mg_{1-x}AE_x)_a(Ge_{1-y}Sn_y)_bO_cHA_d:zMn \quad (A)$$

wherein AE represents at least one or more elements selected from the group consisting of Ca and Sr;

HA represents at least one or more elements selected from the group consisting of F or Cl;

$2.54 \leq a \leq 4.40$,
$0.80 \leq b \leq 1.10$,
$3.85 \leq c \leq 7.00$,
$0 \leq d \leq 2.00$,
$0 \leq x \leq 0.05$,
$0 \leq y \leq 0.10$, and
$0 < z \leq 0.03$, and emits light having a main emission peak in the wavelength region of equal to or greater than 650 nm and equal to or less than 665 nm when excited by light in the wavelength region of greater than 420 nm and equal to or less than 500 nm. Here, the half width of the main emission peak is 30 nm or less. The light emission spectrum of a phosphor can be obtained by exciting the phosphor using a near-ultraviolet region LED having an emission peak at 400 nm, a blue-region LED having an emission peak at 460 nm, or the like, and measuring the light emitted by the phosphor with, for example, an IMUC-7000G type spectrophotometer (trade name; manufactured by Otsuka Electronics Co., Ltd.).

The temperature characteristics as described herein are defined as follows. First, as a reference value, a sample is excited with a blue-region LED, a near-ultraviolet region LED or the like at room temperature (25° C.), and a light emission spectrum of the sample is measured. The peak intensity of the light emission spectrum at this time is designated as $I_0$. Next, a light emission spectrum is measured at an arbitrary temperature higher than room temperature, and the peak intensity of the light emission spectrum at that time is designated as $I_1$. The ratio of these peak intensities ($\Delta I = I_1/I_0$) is defined as the temperature characteristics. Generally, as the temperature rises, the peak intensity decreases, and the value of $\Delta I$ decreases. However, as the change of the peak intensity is smaller, that is, as the value of $\Delta I$ approaches unity, the phosphor, or the light emitting device, has better temperature characteristics.

A phosphor having satisfactory temperature characteristics has satisfactory luminescence characteristics and has less color shift, even when the phosphor is used in a light emitting device together with a high power type LED which is prone to suffer from an increase in the junction temperature. Accordingly, a light emitting device having excellent luminescence characteristics can be obtained.

The light emitting element used in the embodiments of the invention is a light emitting element, for example, an LED chip, which emits light having an emission peak wavelength of greater than 420 nm and equal to or less than 500 nm. The light emitted from this light emitting element excites the phosphor that will be described later. According to the embodiment of the present invention, a light emitting element which dissipates a larger amount of heat as compared with conventionally used light emitting elements is employed. Specifically, a light emitting element which has a junction temperature of from 100° C. to 200° C. at the time of continuous driving is used. The junction temperature of a light emitting element can be determined from the input electric power and the thermal resistance of a white LED light emitting device.

An easiest method to increase the luminance of a light emitting device is a method of inputting a larger amount of electric power to the light emitting element, and thereby increasing the amount of light emitted from the light emitting element, as well as the amount of light emitted from the phosphor excited by the light emitted from the light emitting element. Therefore, it is anticipated that the amount of input electric power will be increased in the future, according to the demand for further increase in the luminance of LED light emitting device. The guaranteed junction temperature of many LED chips that are currently used is 125° C., and the temperature at the time of continuous driving is usually 100° C. or lower. The is because, in the case where a conventional phosphor is used, when the amount of power input to the light emitting element is increased, the temperature of the light emitting element and the temperature of the phosphor that is in contact with the light emitting element increase, and a high luminescence efficiency is not obtained.

On the other hand, the light emitting device according to this embodiment is made capable of maintaining high luminescence efficiency even at temperatures higher than conventional circumstances, by using a particular phosphor. To be more specific, use is made of a light emitting element having a junction temperature of equal to or higher than 100° C. and equal to or lower than 200° C. at the time of continuous driving. It has been known that such a light emitting element cannot give sufficient luminescence efficiency, even though used in conventional light emitting devices. Generally, the amount of electric power input to a light emitting element having a junction temperature of 100° C. or higher is 1 W or more. As previously described, it is anticipated that the amount of input electric power will be increased in the future, according to the demand for further increase in the luminance of LED light emitting device, and thus there is a possibility that the guaranteed value of the junction temperature may rise. However, in order to maximally decrease the burden on LED chips, it is preferable to reduce the thermal resistance as much as possible. Currently, the thermal resistance of white LED light emitting devices is about 40° C./W. However, in the light emitting device according to this embodiment of the invention, since satisfactory light emitting characteristics can be obtained if a certain degree of temperature increase is accompanied, the thermal resistance is preferably 20° C./W or higher.

As described above, unlike the conventional light emitting devices, the light emitting device according to this embodiment is maintained at high temperature when continuously driven. As a specific example, there may be mentioned an LED light emitting device, in which an electric current corresponding to an electric power of 3 W is input to a semiconductor light emitting element having a thermal resistance of 34° C./W and a junction temperature of 140° C., at an ambient temperature of 25° C. Furthermore, according to another embodiment of the invention, there may be mentioned an LED light emitting device, in which a current corresponding to an electric power of 2.5 W is input to a semiconductor light emitting element having a thermal resistance of 30° C./W and a junction temperature of 185° C., at an ambient temperature of 50° C.

The light emitting element in a light emitting device is usually supported by a supporting member. This supporting member may have a function of maintaining an electrical connection to the outside. As a supporting member capable of realizing such an electrical connection, use may be made of a supporting member having a wiring pattern provided on the surface of an insulative frame member, or a supporting member formed of a metal. Particularly, it is preferable to use a ceramic material for the frame member of the supporting member, so as to realize high thermal conductivity. The light emitting element according to this embodiment of the invention easily undergoes a temperature rise during driving of the light emitting element. As a result, when the periphery of the light emitting element is maintained at a temperature higher than necessary, significant deterioration of the light emitting element occurs, and melting or deformation of the light emitting element may occur. In such a case, the heat dissipation properties can be improved by using a supporting member having high thermal conductivity, and thereby, the light emitting element and the like can be prevented from reaching an excessively high temperature. Examples of the ceramic material that can be used include aluminum nitride and aluminum oxide (alumina). Among them, aluminum nitride is an insulating material having a thermal conductivity of 1.70 (W/cm·° C.), and is capable of patterning. Accordingly, production of light emitting devices of multi-chip type is made possible, which is desirable. Furthermore, copper (Cu) may also be used as the supporting member. Since copper has very high thermal conductivity, such as a thermal conductivity of 3.94 (W/cm·° C.), copper is one of the most suitable materials as the supporting member that is used in high power type LED light emitting devices.

It is preferable that the light emitting element be bonded to the supporting member through metal bonding such as, for example, solder bonding. Through the metal bonding, the adhesion strength between the LED chip and the supporting member can be increased.

The light emitting device according to this embodiment of the invention includes a light emitting element such as described above, and a phosphor layer disposed thereon. The phosphor layer can be constructed from a resin layer having a phosphor dispersed therein. There are no particular limitations on the resin used in the phosphor layer, but for example, a silicone resin can be used. Silicone resins undergo less light-induced discoloration, have satisfactory heat dissipation properties, and are capable of suppressing an excessive temperature rise in the light emitting device, which is desirable.

According to this embodiment of the invention, at least a part of the phosphor contained in the phosphor layer is a phosphor having a composition represented by the following general formula (A):

(A)

Here, AE represents at least one or more elements selected from the group consisting of Ca and Sr, and HA represents at least one or more elements selected from the group consisting of F and Cl. a, b, c, d, x, y and z satisfy the following relationships in order to maintain the luminescence efficiency high:

$2.54 \leq a \leq 4.40$, preferably $3.47 \leq a \leq 4.26$;
$0.80 \leq b \leq 1.10$, preferably $0.95 \leq b \leq 1.00$;
$3.85 \leq c \leq 7.00$, preferably $4.02 \leq c \leq 6.87$;
$0 \leq d \leq 2.00$, preferably $0 \leq d \leq 0.83$;
$0 \leq x \leq 0.05$, preferably $0 \leq x \leq 0.04$;
$0 \leq y \leq 0.10$, preferably $0.02 \leq y \leq 0.08$; and
$0 < z \leq 0.03$, preferably $0.01 \leq z \leq 0.02$.

Here, if a, b or c is outside the range described above, the luminescence efficiency decreases, which is not desirable. Furthermore, if w, x or y is beyond the range described above, the luminescence intensity decreases, which is not desirable. Although the reason for this is not clear, it is speculated that if these parameters are outside the ranges described above, the basic crystal structure of the phosphor or the crystallinity of the periphery of $Mn^{4+}$ cannot be maintained.

Among phosphors having such a composition, a compound represented by the following general formula (B) is particularly preferred.

(B)

wherein AE is at least one selected from Ca and Sr;
$3.5 \leq a' \leq 4.4$, preferably $3.9 \leq a' \leq 4.2$;
$0.8 \leq b' \leq 1.1$, preferably $0.9 \leq b' \leq 1.0$;
$5.5 \leq c' \leq 7.0$, preferably $5.5 \leq c' \leq 6.9$;
$0 < d' \leq 0.41$, preferably $0 < d' \leq 0.25$;
$0 < x' \leq 0.05$, preferably $0 < x' \leq 0.04$;
$0 < y' \leq 0.10$; and
$0 < z' \leq 0.03$.

Specific examples of such a preferred phosphor include $(Mg_{0.96},Ca_{0.04})_{3.9}(Ge_{0.90},Sn_{0.10})_{1.0}O_{6.2},Cl_{0.15}:0.02Mn$, and $(Mg_{0.95},Sr_{0.05})_{4.3}(Ge_{0.90},Sn_{0.10})_{1.0}O_{6.9},Cl_{0.35}:0.02Mn$. These phosphors have particularly high luminescence intensities, and are particularly effective when the light emitting device according to this embodiment is used in illumination applications.

The phosphor according to this embodiment of the invention contains manganese (Mn). Therefore, z in the above general formula (A) is greater than zero. If Mn is not contained (z=0), even if the phosphor is excited with light having an emission peak in the region from ultraviolet to blue, light emission (spectrum) cannot be obtained. On the other hand, if the content of Mn is too large, a concentration quenching phenomenon occurs, and thereby the luminescence intensity of the phosphor is weakened. Thus, the upper limit of z is defined as 0.03.

This phosphor is excited by the light emitted from the light emitting element, and emits light of red color to deep red color. The light emission spectrum of the emitted light has a main emission peak in the wavelength region of equal to or greater than 650 nm and equal to or less than 665 nm. Generally, the half width of the main emission peak is 20 nm or less.

The phosphor of the invention is reported to have, as a basic crystal structure, a crystal structure in which an $MgO_6$ unit lattice is conjugated with an octahedral $GeO_6$ unit lattice and a tetrahedral $GeO_4$ unit lattice. Thus, Mn, which is an activator, is believed to be substituting the (Mg, Ca) site and the (Ge, Sn) site of the octahedron, as shown from a resulting light emission spectrum. However, it is generally difficult to determine the substitution ratio accurately. According to the embodiments of the invention, the substitution ratio is defined as the concentration of Mn contained in the phosphor.

An analysis of the content of the respective elements contained in the phosphor can be performed by any known method. For example, metal elements such as magnesium (Mg), calcium (Ca), strontium (Sr), germanium (Ge), tin (Sn) and manganese (Mn) can be analyzed by an inductively coupled plasma (ICP) emission spectroscopy. Specifically, the phosphor can be melted by alkali fusion and analyzed using an emission spectrophotometric analyzer (for example, SPS-4000 (trade name), manufactured by SII NanoTechnology, Inc., or the like). Furthermore, a non-metallic element O can be analyzed by an infrared absorption method. Specifically, the phosphor can be melted by inert gas fusion and analyzed by an infrared absorption method using, for example, a TC-600 series oxygen and nitrogen analyzer (trade name; manufactured by LECO Corporation) or the like. Non-metallic elements F and Cl can be analyzed by an ion chromatographic method. Specifically, the phosphor can be separated by thermal hydrolysis and analyzed by an ion chromatographic method using, for example, a DX-120 type ion chromatographic system (trade name, manufactured by Nippon Dionex K.K.).

Specifically, the phosphor according to this embodiment can be produced by a method such as described below. As the starting raw materials, oxide, chloride and carbonate compound powders of the constituent elements can be used. Raw materials of the constituent elements are weighed in predetermined amounts and are mixed with a ball mill or the like. For example, use can be made of, as a Mn raw material, $MnCO_3$, $Mn_2O_3$, $MnO_2$, $MnF_2$, $MnCl_2$ or the like; as a Mg raw material, (basic) magnesium carbonate ($mMgCO_3.Mg(OH)_2.nH_2O$, for example, m=3 and n=3), MgO, $MgF_2$, $MgCl_2$ or the like; as a Ca raw material, $CaCO_3$, CaO, $CaF_2$, $CaCl_2$, $CaCl_2.2H_2O$, or the like; as a Sr raw material, $SrCO_3$, SrO, $SrF_2$, $SrCl_2$, $SrCl_2.6H_2O$, or the like; as a Ge raw material, $GeO_2$ or the like; and as a Sn raw material, $SnO_2$ or the like. The oxide raw material, carbonate raw material and chloride raw material are prepared in accordance with the composition ratio of the compound to be synthesized. Mixing may be carried out by a dry mixing method that does not use a solvent, or a wet mixing method that uses an organic solvent such as ethanol.

Furthermore, it is general to use an excess amount of the HA raw material, in consideration of the sublimation of the F and Cl sources caused by high temperature calcination for the synthesis of phosphor. Examples of such a HA raw material include ammonium halides such as ammonium fluoride and ammonium chloride. Furthermore, fluorides and chlorides of alkali metals, or fluorides and chlorides of alkaline earth metals may also be used. These HA raw materials act as crystal growth agents. In order to prevent a discrepancy from the intended composition, the amount of addition of the HA raw material is preferably set at from about 0.01% by weight to 0.3% by weight of the total amount of the raw material powder. In the case of using a halide of an alkali metal or an alkaline earth metal, there is a possibility that the alkali metal or the alkaline earth metal may be dissolved in the solid state into the phosphor or may react with another raw material to produce a different phase. Therefore, it is preferable to set the amount of addition at 0.1% by weight or less.

The raw material mixture formed by mixing these raw material powders is placed in a container such as a crucible and is subjected to a heat treatment to obtain a calcination product. The heat treatment is carried out in an air atmosphere or in a $N_2$ or Ar atmosphere. This is to prevent sublimation of halogen elements, to prevent hygroscopic properties of the raw materials, and also to promote synthesis of the phosphor. It is also possible to use a mixture of $F_2$ or $Cl_2$ gas with HF or HCl gas, but since the heat treatment facilities or exhaust treatment facilities require high cost, a heat treatment in an air atmosphere or in a $N_2$ or Ar atmosphere is preferred. The temperature and time for the heat treatment can be generally set at 1000° C. to 1400° C. and 0.5 to 10 hours. If the calcination temperature is too low, or the calcination time is too short, the raw materials remain unreacted, and the luminescence intensity of the phosphor is decreased. If the calcination temperature is too high, or the calcination time is too long, there is a possibility that the raw materials or the product may melt up, or a possibility that a part of the mixed raw materials may sublime. Furthermore, the calcination product thus obtained may be pulverized, placed again in a container, and subjected to secondary calcination in air or in a $N_2$ or Ar atmosphere. The pulverization method during the secondary calcination is not particularly limited as long as the surface area increases, and for example, a method of crushing a mass of a primary calcination product using a mortar or the like, is employed. Furthermore, during the secondary calcination, the halide crystal growth agent described above may be added.

The phosphor obtained after calcination can be subjected, if necessary, to a post-treatment such as washing with pure water or the like, before being applied to a light emitting device or the like.

Figure 1:
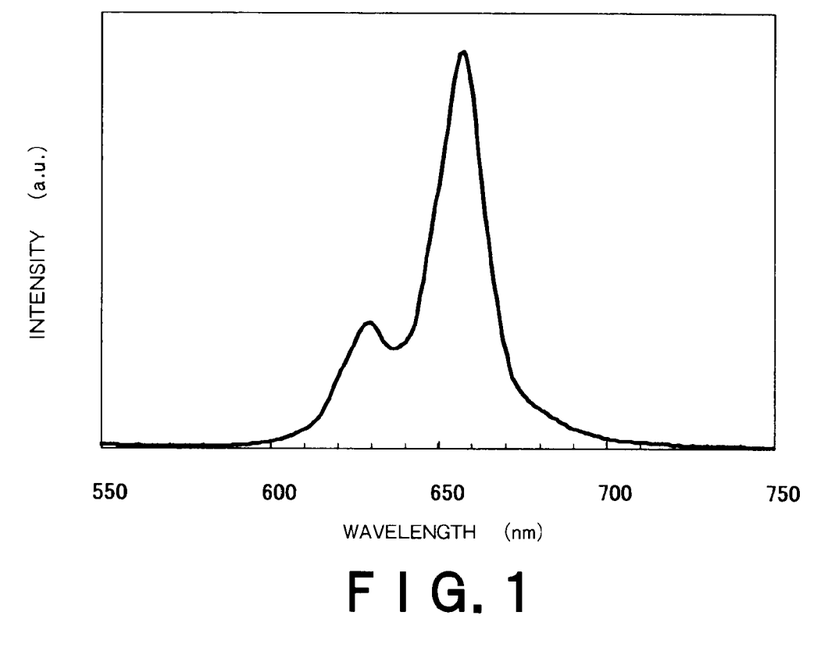
FIG. 1 is a light emission spectrum of the red phosphor used in the embodiments of the invention.

As an example of the phosphor represented by the general formula (A) according to this embodiment of the invention, which may be obtained by the synthesis method described above, the phosphor of $3.5MgO.0.5MgF_2.GeO_2$:0.01Mn [=$Mg_4GeO_{5.5}F$:0.01Mn] may be mentioned. This phosphor is designated as phosphor No. 1. This phosphor was excited with a light which was emitted from a blue LED and had a peak wavelength of 442 nm, and its light emission spectrum was measured. The results are as shown in FIG. 1. It can be seen from FIG. 1 that the phosphor No. 1 has the main emission peak of the light emission spectrum near 658 nm, and a second emission peak near 630 nm. Here, the main emission peak means a peak having the highest peak intensity in the light emission spectrum, and the second emission peak means a peak having the second highest peak intensity.

Figure 2:
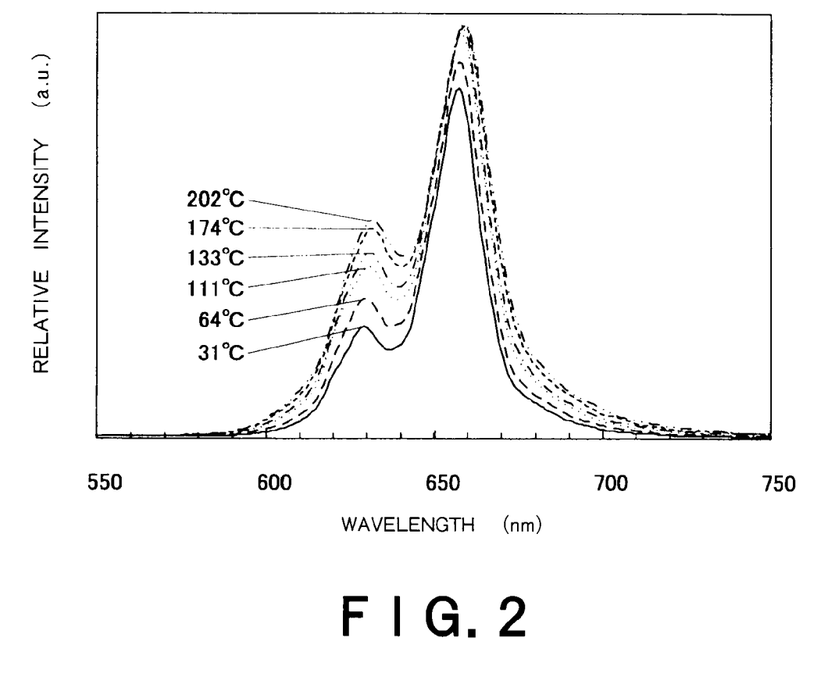
FIG. 2 is a set of light emission spectra, concomitant with changes in temperature, of the red phosphor used in the embodiments of the invention.
Figure 3:
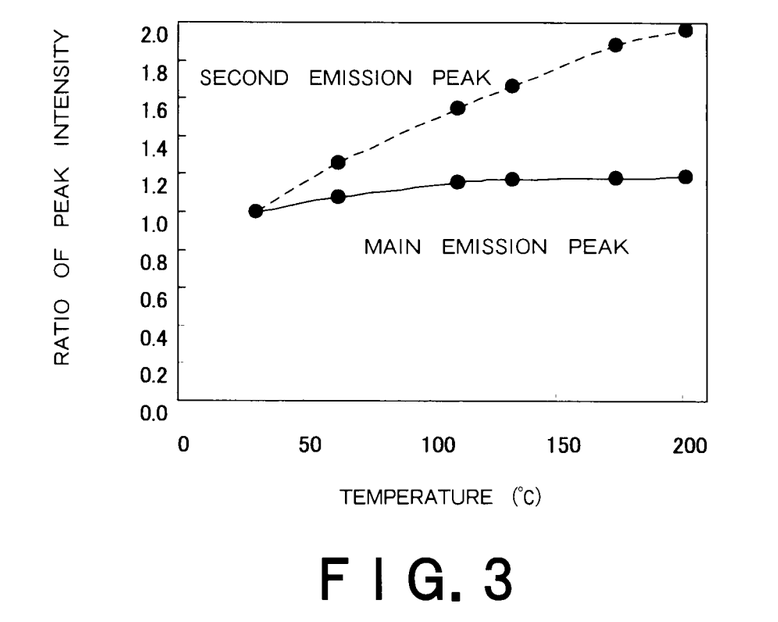
FIG. 3 is a graphic diagram showing the changes in the emission peak intensities with temperature of the red phosphor used in the embodiments of the invention.

For the phosphor No. 1, an evaluation was carried out on the change in the luminescence intensity with a change in temperature for a temperature range of from room temperature to 200° C. First, the phosphor was thinly spread on a hot plate capable of temperature control from room temperature to 200° C. The temperature of the phosphor layer that had been thinly spread was increased from room temperature (about 30° C.) to near 200° C. at an interval of 30° C. to 50° C., and was left to stand for 1 to 3 minutes at each of the increased temperatures. Subsequently, the phosphor was excited with a light that was emitted from a blue LED and had a peak wavelength of about 442 nm, and the light emission spectrum of the phosphor was measured. FIG. 2 shows changes in the light emission spectrum from room temperature to 200° C., and FIG. 3 shows the ratio of the emission peak intensities with respect to the luminescence intensity at room temperature. The main emission peak intensity of the phosphor No. 1 was such that the peak intensity did not decrease in the temperature increase up to 200° C., and at near 130° C., the intensity reached approximately 1.18 times the intensity at room temperature. Furthermore, at near 130° C., the second emission peak intensity reached approximately 1.66 times the intensity at room temperature, and at near 200° C., the second emission peak intensity reached approximately 1.96 times the intensity at room temperature. When compared with the luminescence efficiency at room temperature, the luminescence efficiency at near 130° C. increased to approximately 1.5 times.

There have hitherto been reports on the temperature characteristics related to the phosphor $3.5MgO.0.5MgF_2.GeO_2$:Mn. However, those reports are all on the investigation of temperature characteristics in the case of achieving excitation with light having a shorter wavelength, for example, light at 365 nm. Therefore, there has been no report on the investigation in relation to the excitation with light having a longer wavelength. However, the phosphor represented by the general formula (A) has two excitation bands, and one of them is an excitation band which is attributed to $^4A_2 \rightarrow {}^4T_1$ that is present on the short wavelength side, while the other one is an excitation band which is attributed to $^4A_2 \rightarrow {}^4T_1$ that is present on the long wavelength side. That is, the temperature characteristics that have been reported so far were only the temperature characteristics attributable to the excitation bands present on the short wavelength side described above. The wavelength region of the light emitted from the light emitting element used in this embodiment is a range of wavelength for the excitation band on the long wavelength side, and the light emitting element uses an excitation light that is different from the conventional reports. The results shown in FIG. 2 and FIG. 3 are obtained by an excitation/emission mechanism that is different from the temperature characteristics that have hitherto been reported, and such a finding is a new finding made by the present inventors. Furthermore, nothing is known about the uniqueness of the light emission spectrum in which the ratio of the main emission peak intensity and the second emission peak intensity changes with temperature when the phosphor is excited to the excitation band on the long wavelength side as described above. This is also another finding made by the present inventors.

Figure 4:
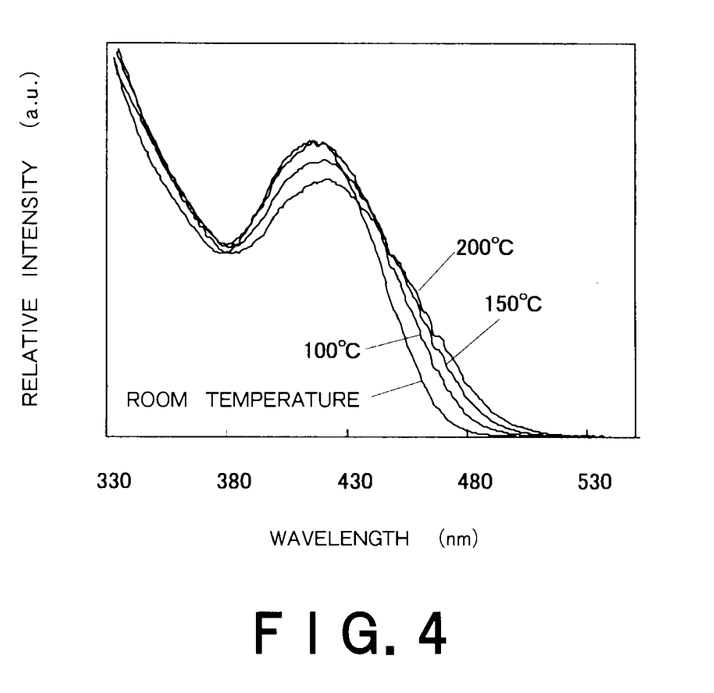
FIG. 4 is an excitation spectrum, concomitant with changes in temperature, of the red phosphor used in the embodiments of the invention.

One of the causes for the phosphor exhibiting such satisfactory temperature characteristics by an excitation light having an emission peak in the wavelength region of greater than 420 nm and equal to or less than 500 nm, is thought to be a change in the excitation spectrum in response to temperature change. FIG. 4 shows changes in the excitation spectrum when the temperature was changed from room temperature to 200° C. The excitation spectrum was measured with a fluorescent spectrophotometer by mounting a pelletized phosphor on a heated stage, and adjusting the temperature with a heater, while passing a stream of dry nitrogen. An example of the fluorescent spectrophotometer that can be used may be SPEX Fluorog 3-22(trade name, manufactured by Horiba Jobin Yvon, Ltd.). The excitation spectrum was measured for the emission wavelength of the phosphor No. 1 at 658 nm. It was confirmed from the measured excitation spectrum that an excitation band is present from 250 nm to near 490 nm. As described above, the excitation mechanism attributable to $Mn^{4+}$ is generally explained with the $^4A_2 \rightarrow {}^4T_2$ transition or the $^4A_2 \rightarrow {}^4T_1$ transition, but the excitation spectrum peak extending from near 380 nm to near 490 nm as shown in FIG. 4 is explained as the $^4A_2 \rightarrow {}^4T_2$ transition on the long wavelength side. Furthermore, the excitation band of wavelengths shorter than 380 nm belongs to the $^4A_2 \rightarrow {}^4T_1$ transition. As shown in FIG. 4, the excitation spectrum peak belonging to the $^4A_2 \rightarrow {}^4T_2$ transition tends to shift to the long wavelength side along with an increase in temperature, and to have the half width broadened. For this reason, when an examination is made on the temperature-dependent change of the excitation spectrum intensity for specific wavelengths greater than 420 nm and equal to or less than 500 nm, the excitation spectrum intensity increases as the temperature increases. As a result, it is thought that there were obtained satisfactory temperature characteristics in which the luminescence intensity increases when the temperature increases. On the other hand, in regard to the excitation band on the short wavelength side, which belongs to the $^4A_2 \rightarrow {}^4T_1$ transition, the excitation spectrum practically did not shift with the temperature change from room temperature to 200° C.

From the temperature dependency of the excitation spectrum shown in FIG. 4, it was found that when the phosphor was excited with light having a wavelength of greater than 420 nm and equal to or less than 500 nm, satisfactory light emission characteristics such as described above can be realized in the temperature range of from 100° C. to 200° C.

Furthermore, if necessary, the phosphor particles produced according to the invention can be coated on the surface with a surface layer material formed of at least one selected from a silicone resin, an epoxy resin, a fluororesin, tetraethoxysilane (TEOS), silica, zinc silicate, aluminum silicate, calcium polyphosphate, a silicone oil, and a silicone lubricant. Zinc silicate and aluminum silicate are represented by, for example, $ZnO.pSi_2$ ($1 \leq p \leq 4$) and $Al_2O_3.qSiO_2$ ($1 \leq q \leq 10$), respectively. It is not necessary for the phosphor particle surfaces to be completely covered with the surface layer material, and a part of the surfaces may be exposed. When the surfaces of the phosphor particles are covered with the surface layer material, effects such as prevention of deterioration due to external factors such as heat, humidity and ultraviolet radiation, can be obtained. Furthermore, it is made possible to regulate the dispersibility of the phosphor, so that design of the phosphor layer can be facilitated. The surface layer material can be applied by immersing phosphor particles in a dispersion liquid or solution containing the material for a predetermined time, and then drying by heating or the like. In order to obtain the effects of the surface layer material without impairing the essential functions of the phosphor, it is preferable for the surface layer material, if present, to be present at a proportion of about 0.1% to 5% by volume of the phosphor particles.

Furthermore, the phosphor used in this embodiment can be classified in accordance with the method of application on the light emitting device to be used. In the case of using the phosphor in a white LED light emitting device, it is preferable to classify the phosphor particles and to use particles having a size of about 5 μm to 50 μm. If the particle size of the phosphor is too small, the proportion of a non-light emitting layer on the surface increases, and the luminescence intensity tends to be decreased. Furthermore, if the particle size is too large, the phosphor may clog the phosphor layer coating device when the phosphor layer is applied, so that a decrease in the operation efficiency or yield is likely to occur, and the particles may cause color unevenness in finished light emitting devices.

The phosphor represented by the general formula (A) is a phosphor that emits light of red color to deep red color. Therefore, a white light emitting device can be obtained by using the phosphor in combination with a blue light emitting phosphor or with a green phosphor and a yellow phosphor.

The phosphor that is used in combination with the phosphor represented by the general formula (A) can be changed in accordance with the purpose of the light emitting device. For example, in the case of using a light source in the blue wavelength region, a white light emitting device can be provided by using a yellow phosphor in combination with the phosphor represented by the general formula (A). Furthermore, in order to provide a white light emitting device with a low color temperature, a light emitting device achieving a good balance between luminescence efficiency and color rendering properties by using the phosphor represented by the general formula (A) and a yellow phosphor in combination.

However, the green and yellow phosphors that are used in combination are preferably phosphors having excellent temperature characteristics. This is because, in the case where the luminescence intensity of the phosphor used in combination is largely dependent on temperature, temperature quenching of the phosphor occurs due to the heat generated from the light emitting element at the time of driving, and a decrease in efficiency, or a color shift in accordance with the electric power input may occur. Specifically, it is preferable that the temperature characteristics ΔI of the phosphor that is used in combination be 80% or greater.

In regard to the construction of a white light emitting device, the phosphor that emits light of blue-green color, green color or yellow color (hereinafter, referred to as a second phosphor), which is used in combination with the phosphor represented by the general formula (A), has a main emission peak in the wavelength region of equal to or greater than 500 nm and equal to or less than 580 nm. Specific examples of the phosphor that satisfy the above-mentioned conditions include silicate phosphors such as (Sr, Ca, Ba)$_2$SiO$_4$:Eu, Ca$_3$(Sc, Mg)$_2$Si$_3$O$_{12}$:Ce, and Li$_2$SrSiO$_4$:Eu; aluminate phosphors such as (Y, Gd)$_3$(Al, Ga)$_5$O$_{12}$:Ce, and BaMgAl$_{10}$O$_{17}$:Eu, Mn; sulfides such as (Ca, Sr, Ba)Ga$_2$S$_4$:Eu; and alkaline earth oxynitride phosphors such as (Ca, Sr, Ba)Si$_2$O$_2$N$_2$:Eu, and (Ca, Sr)-αSiAlON. In addition, if almost no change occurs in the basic crystal structure even when small amounts of elements are added to a phosphor exemplified herein, the resulting phosphor may be regarded as the same phosphor.

When the peak wavelength of the light emitting element used is near 420 nm, a phosphor that emits blue light may be further added to the combination, in addition to the second phosphor described above. Here, the phosphor that emits blue light is a phosphor having a main emission peak in the wavelength region of equal to or greater than 440 nm and equal to or less than 500 nm. Preferred examples of the blue phosphor include halophosphate phosphors such as (Sr, Ca, Ba, Mg)$_5$(PO$_4$)$_3$(Cl, Br):Eu; phosphate phosphors such as 2SrO.0.84P$_2$O$_5$.0.16B$_2$O$_3$:Eu; and alkaline earth metal aluminate phosphors such as BaMgAl$_{10}$O$_{17}$:Eu.

In addition to those, a phosphor that emits light of orange color or red color may also be used in combination as necessary.

Examples of the phosphor that emits light of orange color or red color include silicate phosphors such as (Sr, Ca, Ba)$_2$SiO$_4$:Eu, and (Sr, Ba, Ca)$_3$SiO$_5$:Eu; sulfide phosphors such as (Ca, Sr, Ba)S:Eu; and nitride phosphors such as (Sr, Ba, Ca)$_2$Si$_5$(O, N)$_8$:Eu, and (Sr, Ca)AlSiN$_3$:Eu. When these phosphors are used in combination in the light emitting device according to this embodiment, further improvement can be seen in not only the efficiency, but also in the color rendering properties for the illumination applications, or the color gamut in the backlight applications. However, since the emission color of the phosphor represented by the general formula (A) is from red to deep red, when the phosphor is combined with a phosphor that emits light of orange color or red color, the effects of the embodiment may be impaired. Therefore, in the case of using the phosphor that emits light of orange color or red color in combination, it is preferable to use a phosphor having a main emission peak wavelength of 640 nm or less.

Figure 5:
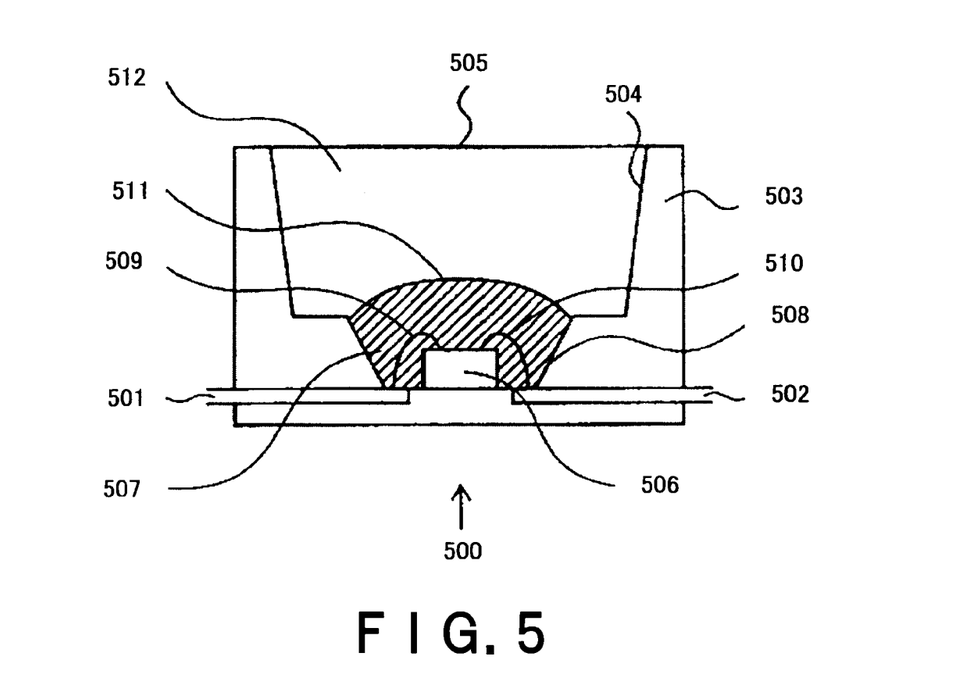
FIG. 5 is a cross-sectional view of a light emitting device according to an embodiment of the invention.

FIG. 5 shows a cross-sectional view of a light emitting device according to an embodiment of the invention.

In the light emitting device depicted therein, a resin stem 500 has a lead 501 and a lead 502, which are formed by shaping a lead frame, and a resin section 503, which is formed to be integrated to these leads. The resin section 503 has a depressed section 505, which has an upper opening that is wider than the bottom surface, and a reflective surface 504 is provided on the lateral surface of this depressed section.

At the center of the approximately circular bottom surface of the depressed section 505, a light emitting chip 506 is mounted by means of a silver (Ag) paste or the like. As the light emitting element 506, a light emitting element having a main emission peak in the wavelength region of greater than 420 nm and equal to or less than 500 nm can be employed. For example, a semiconductor light emitting diode such as an InGaN system or a GaN system, or the like can be used. The electrodes (not depicted) of the light emitting chip 506 are respectively connected to the lead 501 and the lead 502 via bonding wires 507 and 508 that are formed of gold (Au) or the like. In addition, the arrangement of the leads 501 and 502 can be appropriately modified.

A phosphor layer 507 is disposed inside the depressed section 505 of the resin section 503. This phosphor layer 507 can be formed by dispersing the phosphor represented by the general formula (A), and optionally a second phosphor, in a resin layer 511 that is formed of, for example, a silicone resin, at a proportion of from 5% by weight to 50% by weight. The phosphors can be adhered using various binders such as a resin, which is an organic material, or glass, which is an inorganic material.

Suitable as the binder made of an organic material is a transparent resin having excellent lightfastness, such as an epoxy resin or an acrylic resin, in addition to the silicone resin mentioned above. Suitable examples of the binder made of an inorganic material include low melting point glass prepared by using alkaline earth metal borates and the like; ultrafine particles of silica, alumina and the like for attaching phosphor particles having a large particle size; and alkaline earth phosphates obtainable by a precipitation method. These binders may be used singly, or in combination of two or more kinds.

With regard to the light emitting element 506, a flip chip type element having an n-type electrode and a p-type electrode on the same surface can be used. In this case, problems attributable to wires, such as breakage or detachment of wires, and light absorption by wires, can be solved, and thus a semiconductor light emitting device having high reliability and high luminance can be obtained. Furthermore, an n-type substrate can also be used in the light emitting element 506. Specifically, an n-type electrode is formed on the back surface of the n-type substrate, while a p-type electrode is formed on the semiconductor layer surface on the substrate, and an n-type electrode or a p-type electrode is mounted on the leads. The p-type electrode or the n-type electrode can be connected to one of the leads via a wire. The size of the light emitting element 506, and the dimension and shape of the depressed section 505 may be appropriately modified.

Figure 6:
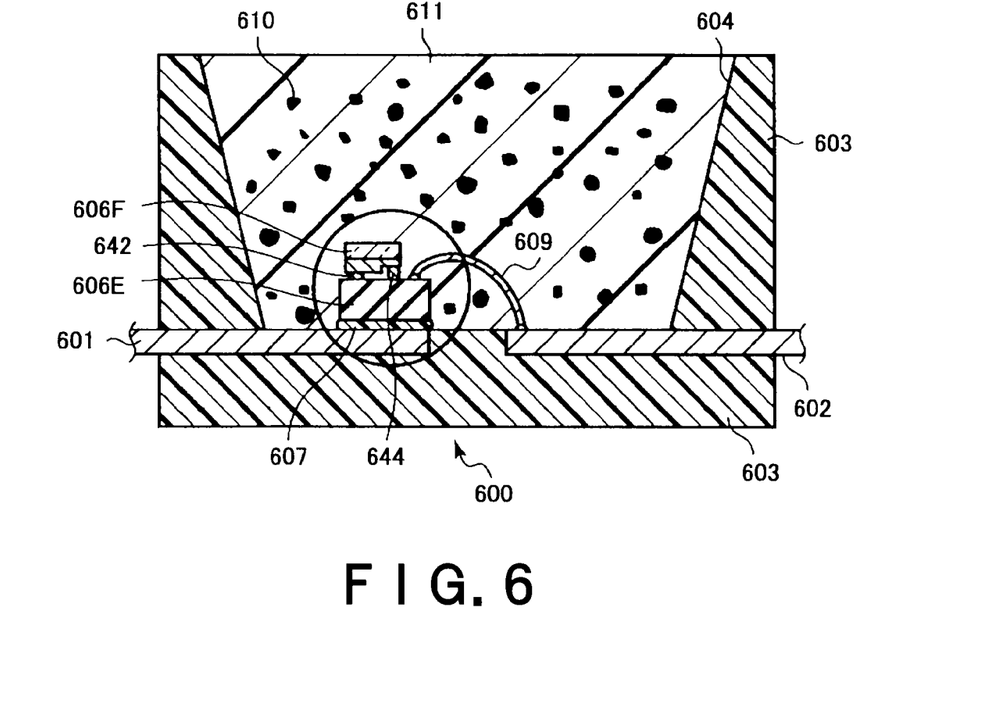
FIG. 6 is a cross-sectional view of a light emitting device according to another embodiment of the invention.

FIG. 6 shows a cross-sectional view of a light emitting device according to another embodiment of the invention. The light emitting device depicted therein has a resin stem 600, a semiconductor light emitting element 606F mounted on the resin stem, and a sealing body 611 that covers this semiconductor light emitting element 606F. The sealed resin stem 600 has leads 601 and 602, which are formed by shaping a lead frame, and a resin section 603, which is formed to be integrated to these leads. The leads 601 and 602 are arranged such that an end of one lead closely faces one end of the other lead. The other ends of the leads 601 and 602 are respectively extended to opposite directions and are led out to the outside from the resin section 603.

The resin section 603 is provided with an opening 605, and on the bottom surface of the opening, a protective Zener diode 606E is mounted by means of an adhesive 607. A semiconductor light emitting element 606F is packaged on the protective Zener diode 606E. That is, the diode 606E is mounted on the lead 601. A wire 609 is connected from the diode 606E to the lead 602.

The semiconductor light emitting element 606F is surrounded by the inner wall surface of the resin section 603, and this inner wall surface is slanted toward the direction of light extraction and acts as a reflective surface 604 that reflects light. The sealing body 611 that is filling inside the opening 605, contains a phosphor 610. The semiconductor light emitting element 606F is laminated on the protective Zener diode 606E. The phosphor represented by the general formula (A), and optionally a second phosphor, are used as the phosphor 610.

Figure 7:
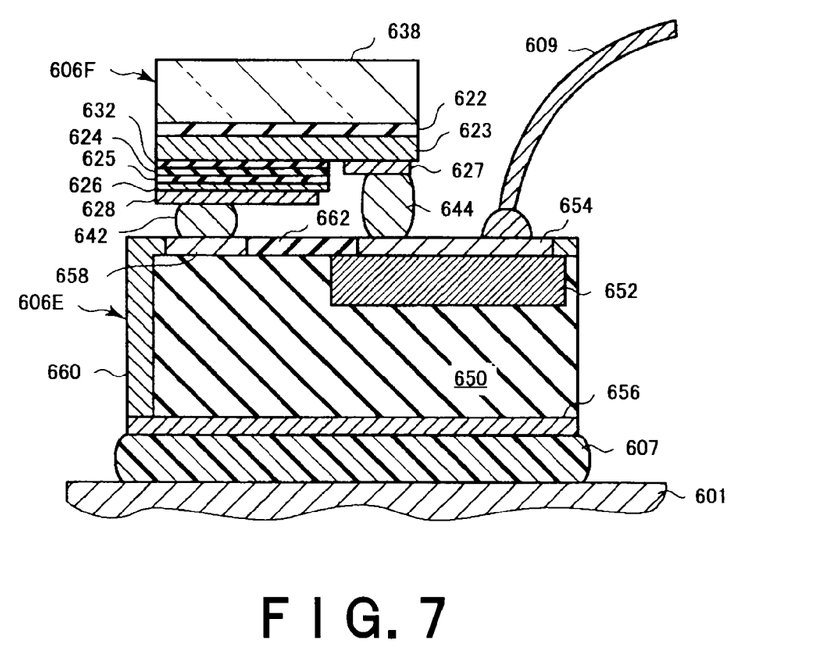
FIG. 7 is a magnified cross-sectional view of the light emitting element used in the embodiments of the invention.

The peripheral area of the light emitting element in the light emitting device will be described in detail below. As shown in FIG. 7, the protective diode 606E has a planar structure in which a p-type region 652 is formed on the surface of an n-type silicon substrate 650. A p-side electrode 654 is formed on the p-type region 652, while an n-side electrode 656 is formed on the back surface of the substrate 650. Opposite to this n-side electrode 656, an n-side electrode 658 is also formed on the surface of the diode 606E. These two n-side electrodes 656 and 658 are connected to each other via a wiring layer 660 the lateral side of the diode 606E. Furthermore, a highly reflective film 662 is formed on the surface of the diode 606E, on which the p-side electrode 654 and the n-side electrode 658 are provided. The highly reflective film 662 is a film having a high reflective ratio with respect to the light emitted from the light emitting element 606F.

In the semiconductor light emitting element 606F, a buffer layer 622, an n-type contact layer 623, an n-type clad layer 632, an active layer 624, a p-type clad layer 625, and a p-type contact layer 626 are sequentially laminated on a translucent substrate 638. Furthermore, an n-side electrode 627 is formed on the n-type contact layer 623, and a p-side electrode 628 is formed on the p-type contact layer 626. Light emitted from the active layer 624 passes through the translucent substrate 638 and is extracted.

The light emitting element 606F having such a structure is flip-chip mounted on the diode 606E via bumps. Specifically, the p-side electrode 628 of the light emitting element 606F is electrically connected to the n-side electrode 658 of the diode 606E through a bump 642. Furthermore, the n-side electrode 627 of the light emitting element 606F is electrically connected to the p-side electrode 654 of the diode 606E through a bump 644. The wire 609 is bonded to the p-side electrode 654 of the diode 606E, and this wire 609 is connected to the lead 602.

Figure 8:
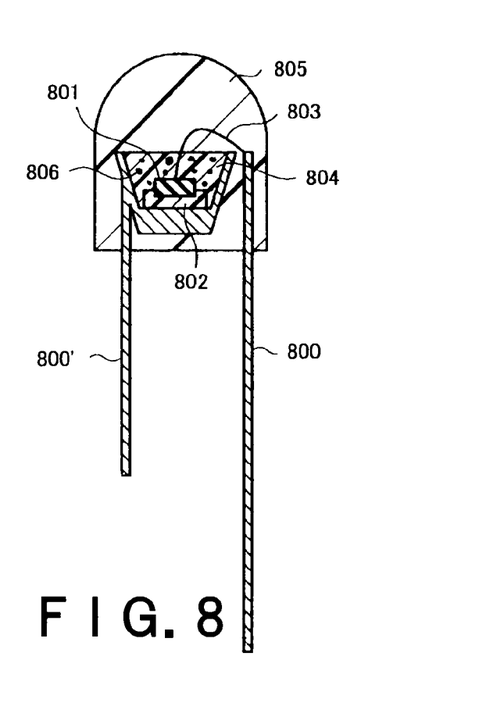
FIG. 8 is a cross-sectional view of a light emitting device according to another embodiment of the invention.

FIG. 8 shows an example of a round type light emitting device. The semiconductor light emitting element 801 is packaged on a lead 800' via a mounting material 52, and is covered with a predip material 804. The lead 800 is connected to the semiconductor light emitting element 801 by a wire 803, and is encased in a casting material 805. The predip material 804 contains the phosphor represented by the general formula (A), and optionally a second phosphor.

As described above, a light emitting device according to this embodiment of the invention, for example, a white LED light emitting device, is optimal for the use in general illuminations and the like, as well as in light emitting devices which use a filter such as a color filter, and a light emitting device in combination, for example, a light source for use in liquid crystal backlight applications. Specifically, the light emitting device can also be used as a light source for liquid crystal backlight. Furthermore, a light emitting device module having plural light emitting devices according to the embodiment arranged within a same substrate, can also be used. Such a module is particularly preferable in the case of using such a light emitting device for use in illumination or the like. Here, the light emitting device according to the embodiment is hardly affected by the heat generated during driving, and is able to realize high luminescence efficiency even at high temperatures. Accordingly, the arrangement density of the light emitting device can be increased, that is, light emitting devices can be arranged with only small distances laid between the devices. As a result, a light emitting device having high luminance can be realized.

Hereinafter, the invention will be described in more detail by way of Examples and Comparative Examples, but the invention is not intended to be limited to the following Examples, as long as the gist is maintained.

Example 1 and Comparative Example 1

Phosphor $3.5MgO \cdot 0.5MgF_2 \cdot GeO_2:0.01Mn$ ($=Mg_4GeO_{5.5}F:0.01Mn$) (phosphor No. 1) and phosphor $(Y, Gd)_3(Al, Ga)_5O_{12}:Ce$ were mixed and dispersed in a silicone resin, and thus a resin mixture was prepared. The temperature characteristics of the phosphor No. 1 were such that, as shown in FIG. 3, temperature quenching was not observed up to near 200° C. On the other hand, the temperature characteristics ΔI at 180° C. of the phosphor $(Y, Gd)_3(Al, Ga)_5O_{12}:Ce$ with respect to room temperature was 80%. There was almost no change in the shape of the light emission spectrum of the phosphor $(Y, Gd)_3(Al, Ga)_5O_{12}:Ce$ from room temperature to 180° C. A white LED light emitting device was produced using this resin mixture, a light emitting element, and a supporting member. The light emitting element had a junction temperature of 140° C. at the time of continuous driving, and a peak wavelength of the light emission spectrum of 445 nm. The supporting member was a cup-shaped member made of copper (Cu), and the inner side wall was coated with alumina which has a high light reflection ratio, and had a function of maintaining electrical connection with the outside. The light emitting element was solder bonded to the bottom surface of the copper supporting member, and a phosphor layer containing the phosphors described above was formed thereon. Thus, a face-up type white LED light emitting device of Example 1 was produced.

Figure 9:
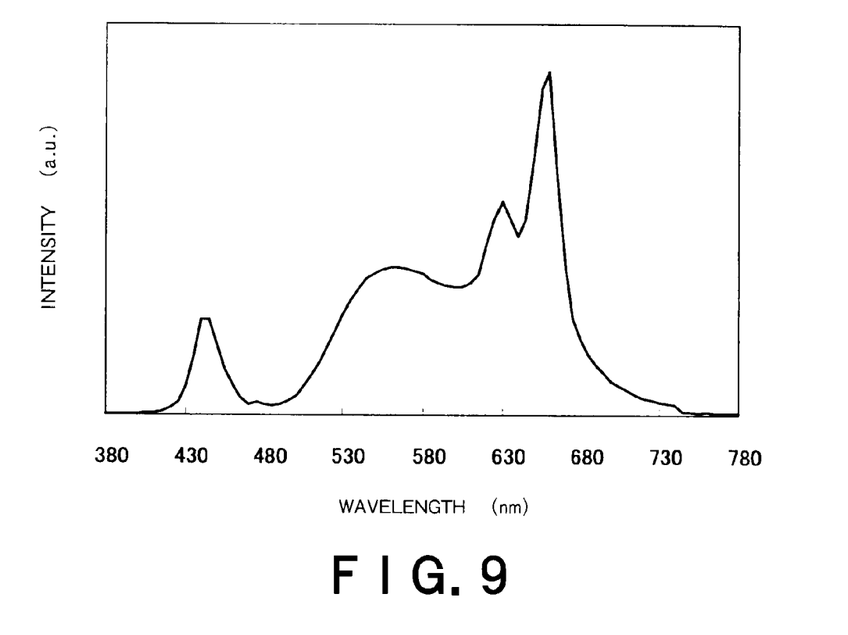
FIG. 9 is a light emission spectrum of the white LED light emitting device of Example 1.

The thermal resistance of this white LED light emitting device was 40° C./W. The mixing ratio of the phosphors was adjusted so as to obtain a color temperature of 2800 K, which is identified as the light bulb color. The white LED light emitting device of Example 1 was driven at an input electric power of 2.5 W at an ambient temperature of 35° C., and the light emission spectrum was measured. FIG. 9 shows the light emission spectrum thus obtained.

Figure 10:
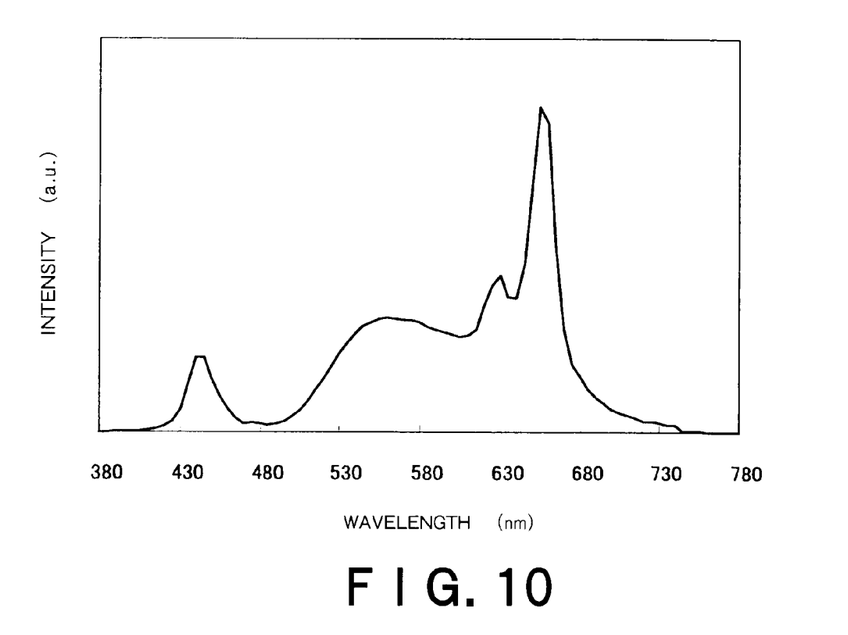
FIG. 10 is a light emission spectrum of the white LED light emitting device of Comparative Example 1.

Next, a light emitting device of Comparative Example 1 was produced, in which the light emitting element of Example 1 was changed to a light emitting element having a junction temperature of 100° C. and a peak wavelength of 445 nm. The thermal resistance of this light emitting device was 40° C./W. The same phosphors as those used in Example 1 were used, and the color temperature was adjusted to the same value as that used in Example 1. The white LED light emitting device of Comparative Example 1 was driven at an input electric power of 0.1 W at an ambient temperature of 35° C., and the light emission spectrum was measured. FIG. 10 shows the light emission spectrum thus obtained.

When FIG. 9 and FIG. 10 are compared, it can be seen that light spectra having a nearly equal shape can be obtained. However, since Example 1 and Comparative Example 1 have different values for the input electric power to the light emitting element, the light emission spectrum of Example 1 which was driven with a larger input electric power, has a higher intensity. Furthermore, when a comparison was made on the luminescence efficiency of the device, it was estimated that the light emitting device of Example 1 had a luminescence efficiency that was approximately 1.4 times higher than that of the light emitting device of Comparative example 1. Here, the luminescence efficiency of the light emitting device represents the light-light conversion efficiency (lm/excitation light W), which is obtained by dividing the light output (excitation light W) before the application of a phosphor layer on the phosphor device, by the light output (light flux–lm) after the application of the phosphor layer. Such an index is used so as to estimate the genuine conversion efficiency of the light emitting layer in the case where the light emitting elements used have different efficiencies.

One factor causing the light emitting device of Example 1 to have superior luminescence efficiency as compared with the light emitting device of Comparative Example 1, may be the difference in the temperature increase that is concomitant with the magnitude of the electric power input to the light emitting element. In other words, it can be seen that the light emitting device according to the embodiment was subjected to a temperature increase upon driving, and when driven at high temperature (equal to or higher than 100° C. and equal to or lower than 200° C.), the light emitting device exhibits high luminescence efficiency.

Subsequently, phosphors of phosphor Nos. 2 to 6, in which the contents of the various constituent elements were changed as indicated in the following Table 1, were produced by the same production method used for the production of the phosphor No. 1. The phosphors thus obtained were subjected to a quantitative analysis by an ICP emission spectrometric method, and as a result, it was confirmed that the compositions were very close to the target composition.

TABLE 1

| Phosphor No. | Phosphor composition |
|---|---|
| 2 | $Mg_{3.56}Ge_{1.00}O_{4.24}F_{0.83}$: 0.01Mn |
| 3 | $Mg_{3.73}Ge_{1.00}O_{4.92}F_{0.62}$: 0.01Mn |
| 4 | $(Mg_{0.99},Ca_{0.01})_{3.47}(Ge_{0.91},Sn_{0.09})_{0.95}O_{5.23}$: 0.02Mn |
| 5 | $(Mg_{0.96},Ca_{0.04})_{3.87}(Ge_{0.90},Sn_{0.10})_{1.00}O_{6.18}Cl_{0.15}$: |
| 6 | $(Mg_{0.95},Sr_{0.05})_{4.26}(Ge_{0.90},Sn_{0.10})_{1.0}O_{6.87}Cl_{0.35}$: |
| 7 | $Mg_{3.38}Ge_{0.95}O_{4.03}F_{0.79}$: 0.01Mn |

Furthermore, light emitting elements were combined with the phosphor Nos. 2 to 6 as indicated in the following Table 2, and thus light emitting devices of Examples 2 to 6 were produced. The light emitting devices of Comparative Examples 2 to 6 were produced by using the same phosphors as those used in Examples 2 to 6, respectively, and adjusting the color temperature to the same color temperatures used in Examples 2 to 6, respectively, except for the light emitting elements which were changed to light emitting elements with suppressed input electric power.

input electric power of 0.1 W at an ambient temperature of 35° C., and the light-light conversion efficiencies (lm/excitation light W) of the light emitting devices were estimated. The ratios of conversion efficiency of Examples 2 to 6 to Comparative Examples 2 to 6 were as shown in Table 3.

TABLE 3

| | Ratio of conversion efficiency |
|---|---|
| Ex. 2/Comp. Ex. 2 | 1.05 |
| Ex. 3/Comp. Ex. 3 | 1.20 |
| Ex. 4/Comp. Ex. 4 | 1.15 |
| Ex. 5/Comp. Ex. 5 | 1.35 |
| Ex. 6/Comp. Ex. 6 | 1.40 |
| Ex. 7/Comp. Ex. 7 | 1.30 |

As shown in Table 3, in the light emitting devices according to the embodiment, an increase in the temperature of the phosphor layer by the light emitting element was expected to occur concomitantly with large input electric power, but the light emitting devices exhibited superior conversion efficiencies as compared to the Comparative Examples in which since the input electric power was small, the temperature of the phosphor layer was considered to be very close to the ambient temperature.

Example 8 and Comparative Example 8

Light emitting devices each produced by arranging four units of the light emitting device of Example 1 in series on an aluminum (Al) substrate having a size of 30 mm×30 mm at an interval of 5 mm, were arranged in parallel in four rows on the same Al substrate at an interval of 5 mm, and thus a light emitting device module was produced. This was designated as the light emitting device module of Example 8. Furthermore, a light emitting device module having the same structure as the module of Example 8 was produced using the light emitting device of Comparative Example 1. This was designated as the light emitting device module of Comparative Example 8.

The input electric power was adjusted such that the input electric power into the respective light emitting devices arranged in these light emitting device modules was 0.8 W, and the luminescence efficiency of each of the modules was measured. When the luminescence efficiency of the light

TABLE 2

| | Peak wavelength of light emitting element (nm) | Phosphor used | Bonding member | Material of supporting member |
|---|---|---|---|---|
| Example 2 | 450 | (No. 2) + $(Sr,Ba)_2SiO_4$: Eu | Au—Sn solder | AlN |
| Example 3 | 460 | (No. 3) + Ca—αSiAlON | Sn—Ag—Cu solder | $Al_2O_3$ |
| Example 4 | 455 | (No. 4) + $Li_2SrSiO_4$: Eu | Bi—Sn solder | Cu |
| Example 5 | 440 | (No. 5) + $(Y,Gd)_3(Al,Ga)_5O_{12}$: Ce | Sn—Ag—In—Bi solder | Ag |
| Example 6 | 420 | (No. 6) + $(Sr,Ca,Ba,Mg)_5(PO_4)_3(Cl,Br)$: Eu + $(Sr,Ca,Ba)Si_2O_2N_2$: Eu | Sn—Ag—Cu solder | Al |
| Example 7 | 420 | (No. 7) + βSiAlON + $Sr_3SiO_5$: Eu | Sn—Ag—Cu solder | Si |

In Example 2 to 6, the respective white LED light emitting devices were driven at an input electric power of 3.0 W at an ambient temperature of 35° C., and the light-light conversion efficiencies (lm/excitation light W) of the light emitting devices were estimated. Similarly, in Comparative Examples 2 to 6, the white LED light emitting devices were driven at an emitting device module of Example 8 was compared with the luminescence efficiency of the light emitting device module of Comparative Example 8, it was estimated that Example 8 had a luminescence efficiency that was approximately 1.1 times higher. One factor causing the light emitting device module of Example 8 to have superior luminescence efficiency as compared with the light emitting device module of Comparative Example 8, may be that since the space between the light emitting devices is narrow, even if the temperature of the respective light emitting devices constituting the module increases, it is difficult for the light emitting device according to the embodiment to have a decrease in the luminescence efficiency. That is, it is understood that the light emitting device according to the embodiment is subject to a temperature increase during driving, and exhibits higher luminescence efficiency as compared with the conventional light emitting devices, when driven at high temperature.

The light emitting device according to the embodiment of the invention can be used in various illumination devices or various display devices, such as a light source for use in illumination, a light source for backlight in LED displays, personal computers and mobile telephones, a traffic signal, a lighting switch, a stop lamp for vehicles, various sensors and various indicators.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A light emitting device comprising a light emitting element having a main emission peak in the wavelength region of greater than 420 nm and equal to or less than 500 nm, and a phosphor layer formed on the light emitting element, wherein the light emitting element has a junction temperature of from 100° C. to 200° C. at the time of continuous driving of the light emitting device, and the phosphor layer contains a phosphor represented by the following general formula (A), which absorbs the light emitted from the light emitting element and thereby emits light having a main emission peak in the wavelength region of equal to or greater than 650 nm and equal to or less than 665 nm:

$$(Mg_{1-x},AE_x)_a(Ge_{1-y},Sn_y)_bO_cHA_d{:}zMn \quad (A)$$

wherein AE represents at least one or more elements selected from the group consisting of Ca or Sr;

HA represents at least one or more elements selected from the group consisting of F or Cl;
2.54≦a≦4.40,
0.80≦b≦1.10,
3.85≦c≦7.00,
0≦d≦2.00,
0≦x≦0.05,
0≦y≦0.10, and
0<z≦0.03.

2. The light emitting device according to claim 1, wherein the phosphor is represented by the following general formula (B):

$$(Mg_{1-x'},AE_{x'})_{a'}(Ge_{1-y'},Sn_{y'})_{b'}O_{c'}Cl_{d'}{:}z'Mn \quad (B)$$

wherein AE is at least one selected from Ca and Sr;
3.5≦a'≦4.4;
0.8≦b'≦1.1;
5.5≦c'≦7.0;
0<d'≦0.41;
0<x'≦0.05;
0<y'≦0.10; and
0<z'≦0.03.

3. The light emitting device according to claim 1, wherein the phosphor is selected from the group consisting of $(Mg_{0.96},Ca_{0.04})_{3.9}(Ge_{0.90},Sn_{0.10})_{1.0}O_{6.2},Cl_{0.15}{:}_{0.02}Mn$, and $(Mg_{0.95},Sr_{0.05})_{4.3}(Ge_{0.90},Sn_{0.10})_{1.0}O_{6.9},Cl_{0.35}{:}_{0.02}Mn$.

4. The light emitting device according to claim 1, wherein the electric power input to the light emitting element is 1 W or more.

5. The light emitting device according to claim 1, having a thermal resistance of 20° C./W or greater.

6. The light emitting device according to claim 1, further comprising a supporting member that supports the light emitting element, wherein the light emitting element is bonded to the supporting member by metal bonding.

7. The light emitting device according to claim 6, wherein the supporting member is formed of a metal or a ceramic material.

8. The light emitting device according to claim 6, wherein the supporting member is formed of aluminum nitride.

9. The light emitting device according to claim 6, wherein the supporting member is formed of copper.

10. The light emitting device according to claim 1, wherein the phosphor layer is formed of a cured product of a silicone resin, with the phosphor being dispersed therein.

11. The light emitting device according to claim 1, wherein the phosphor layer contains a second phosphor having a main emission peak in the wavelength region of equal to or greater than 500 nm and equal to or less than 580 nm, in addition to the phosphor represented by the general formula (A).

12. The light emitting device according to claim 11, wherein the retention ratio of luminescence intensity of the second phosphor with respect to room temperature is 80% or greater.

13. The light emitting device according to claim 11, wherein the second phosphor is selected from the group consisting of a silicate phosphor, an aluminate phosphor, a sulfide phosphor, and an alkaline earth oxynitride phosphor.

14. The light emitting device according to claim 11, wherein the phosphor layer further contains a phosphor having a main emission peak in the wavelength region of equal to or greater than 440 nm and equal to or less than 500 nm, in addition to the phosphor represented by the general formula (A).

15. The light emitting device according to claim 1, wherein the light emitting device is a white light emitting device and the color temperature is warm white color or light bulb color.

16. A light emitting device module, comprising a plurality of the light emitting device according to claim 1 arranged within a same substrate.

* * * * *